(12) United States Patent
Sullivan et al.

(10) Patent No.: US 7,976,894 B1
(45) Date of Patent: Jul. 12, 2011

(54) MATERIALS WITH THERMALLY REVERSIBLE CURING MECHANISM

(75) Inventors: Daniel M. Sullivan, Vichy, MO (US); Marc W. Weimer, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 286 days.

(21) Appl. No.: 12/270,572

(22) Filed: Nov. 13, 2008

Related U.S. Application Data

(60) Provisional application No. 60/987,656, filed on Nov. 13, 2007.

(51) Int. Cl.
*B05D 5/12* (2006.01)

(52) U.S. Cl. ....... 427/98.3; 430/311; 430/330; 427/99.4

(58) Field of Classification Search ............... 430/330, 430/311; 427/98.3, 99.4
See application file for complete search history.

(56) References Cited

U.S. PATENT DOCUMENTS

| | | | |
|---|---|---|---|
| 5,851,738 A | 12/1998 | Thackeray et al. | |
| 7,265,431 B2 | 9/2007 | Sivakumar | |
| 2005/0214674 A1* | 9/2005 | Sui et al. | 430/270.1 |
| 2005/0255410 A1* | 11/2005 | Guerrero et al. | 430/311 |

OTHER PUBLICATIONS

Triethylamine, http://en.wikipedia.org/wiki/triethylamine Sep. 23, 2008, 1 page.
Styrene copolymers, http://www.sigmaaldrich.com/catalog/search/TablePage/2020972; Sep. 23, 2008, 2 pages.
Vinyl Ethers, http://www.sigmaaldrich.com/materials-science/material-science-products.html?TablePage=16371064; Jun. 2, 2009, 4 pages.

* cited by examiner

*Primary Examiner* — Satya B Sastri
(74) *Attorney, Agent, or Firm* — Hovey Williams LLP

(57) ABSTRACT

Novel materials with thermally reversible curing mechanisms are provided. These inventive compositions are useful in forming microelectronic structures, such as dual damascene structures. The compositions comprise a crosslinkable polymer dispersed or dissolved in a solvent system with a crosslinking agent. In use, the compositions are applied to a substrate and crosslinked. Additional layers may be applied on top of the cured layer followed by additional processing steps. Upon exposure to a temperature above the crosslinking temperature of the composition, the cured layer will undergo a decrosslinking reaction to render the layer soluble in common photoresist solvents, including solvents used to make the composition itself. Thus, after processing, the remaining material can be dissolved away without damaging the substrate. The inventive materials are especially suited for processes involving low-k dielectric substrates.

23 Claims, No Drawings

MATERIALS WITH THERMALLY REVERSIBLE CURING MECHANISM

RELATED APPLICATIONS

This application claims the priority benefit of a provisional application entitled MATERIALS WITH THERMALLY REVERSIBLE CURING MECHANISM, Ser. No. 60/987,656, filed Nov. 13, 2007, incorporated by reference herein.

BACKGROUND OF THE INVENTION

1. Field of the Invention

The present invention is concerned with new fill compositions for use in the manufacture of microelectronic devices, particularly dual damascene structures.

2. Description of the Prior Art

As integrated circuit devices grow smaller, there is an increasing need for multi-level interconnects of smaller size and improved feature integrity. The damascene integration scheme is one way to allow for increasing chip densities on a substrate as design rules continue to shrink integrated circuit devices. The damascene process eliminates the need to etch the metal layer that provides the interconnections, permits more densely spaced interconnects, and eliminates the need for dielectric gap-fill materials.

There are two general classes of damascene processes: single damascene and dual damascene. The single damascene process fabricates interconnections by forming a conducting plug through a dielectric layer to connect to the underlying conducting layer. Another dielectric layer is then formed, with the actual interconnect wiring metallization being patterned in the second layer. The dual damascene process constructs multi-level interconnects of smaller size than the single damascene process. Horizontal trenches and vertical holes (i.e., the contact and via holes) are patterned into a single dielectric layer and then filled in one step with a conducting material such as a metal. Dual damascene processes involve fewer steps, resulting in smaller, more complex integrated circuit devices, thus lowering manufacturing complexity and cost.

Despite the advantages of dual damascene processes, patterning and etch processes are made more difficult because of feature topography and more complex stack layers. Several techniques have been developed to address such problems, including self-aligned dual damascene, trench-first dual damascene, and via-first dual damascene processes. The application of self-aligned dual damascene is limited, because it requires a thick, intermediate layer to act as an anti-reflective layer, nearly perfect trench and via alignment, and very high etch selectivity between the dielectric and etch-stop layers. Trench-first dual damascene processes involve first masking and etching the trench, and then aligning the via pattern with the newly etched trenches. Successful trench-first dual damascene processes require achieving very uniform trenches and maintaining critical dimension control of vias, which in turn requires high etch selectivity between the dielectric and etch-stop layers. The use of etch-stop layers may also increase the dielectric constant of the dielectric material, possibly leading to device failure.

Via-first dual damascene is a somewhat simpler technique, because the vias are formed on top of the full stack of layers. The vias are etched, followed by lithography processes to form the trench patterns. Formation of the trench patterns exposes the bottom and sidewalls of the vias to over-etch. Via-first dual damascene requires a fill composition capable of protecting the bottom and sidewalls of the via during the trench etch step, and of planarizing the surface to allow easier trench patterning. Two techniques are commonly used in via-first dual damascene processes: partial fill and full fill. In partial fill processes, the fill material protects only the bottoms of the via holes, requiring consistent coverage and depth control. In full-fill processes, the vias are completely filled and the layer is planarized. The etching process is performed on the top layer.

In either process, once the pattern is created, the remaining fill material in the vias and trenches must be removed so that metal can be deposited in the vias and trenches and the connections made. Traditionally, this removal has been accomplished by an oxygen plasma ash process, which essentially burns away the material. This technique was suitable for older technology; however, as the industry moves toward lower k dielectrics, potential problems arise. For example, these low-k dielectrics and ultralow-k dielectrics are usually organic, instead of inorganic, and some are porous. Thus, these new dielectric materials are very susceptible to etch damage, especially from the oxygen ash process. One concern is that the conventional clean-out techniques can cause an increase in the dielectric constant of the layer, which is detrimental to device performance and negates the purpose of a low-k dielectric to begin with.

Thus, there is a need for new fill materials and processes whereby the remaining material in the via hole can be easily removed without the harsh ash process.

SUMMARY OF THE INVENTION

The present invention overcomes the problems of the prior art by providing new methods of forming microelectronic structures, particularly for dual damascene processes, and the structures thereof.

In more detail, there is provided a method of forming a microelectronic structure. The method comprises providing a substrate having a surface, and applying a composition to at least a portion of the substrate surface. The composition has a crosslinking temperature and comprises a polymer dispersed or dissolved in a solvent system, where the polymer comprises an acid group. The inventive method includes crosslinking the polymer in the composition to yield a crosslinked layer, and heating the layer to a temperature of at least about 25° C. greater than the crosslinking temperature of the composition so as to decrosslink or decompose the polymer.

In another embodiment, there is provided a structure comprising a substrate having a surface; and a layer adjacent the substrate surface. The layer is formed from a composition comprising a polymer dispersed or dissolved in a solvent system, where the polymer comprises recurring monomers of:

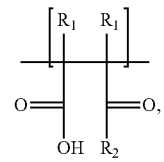

where each $R_1$ is individually selected from the group consisting of —H, and alkyls; and each $R_2$ is individually selected from the group consisting of —$OR_3$, and —$NHR_3$, where each $R_3$ is individually selected from the group consisting of —H, alkyl groups, cycloalkyl groups, and substituted and unsubstituted aryl groups.

The present invention also provides an inventive composition comprising a polymer and a crosslinker dispersed or dissolved in a solvent system, where the polymer comprises recurring monomers of:

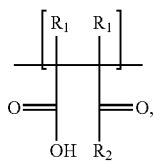

where each $R_1$ is individually selected from the group consisting of —H, and alkyls; and each $R_2$ is individually selected from the group consisting of —$OR_3$, and —$NHR_3$, where each $R_3$ is individually selected from the group consisting of —H, alkyl groups, cycloalkyl groups, and substituted and unsubstituted aryl groups.

DETAILED DESCRIPTION OF THE PREFERRED EMBODIMENTS

The present invention is broadly concerned with compositions that are useful in forming microelectronic structures, such as dual damascene structures, and methods of using those compositions to protect substrates, and particularly contact and via holes formed therein, during circuit manufacturing.

In more detail, the inventive compositions comprise a crosslinkable polymer dispersed or dissolved in a solvent system. The polymer is preferably present in the composition at a level of from about 50 to about 95% by weight, preferably from about 60 to about 90% by weight, and even more preferably from about 70 to about 85% by weight, based upon the total weight of all solids in the composition taken as 100% by weight. Preferred polymers include those that contain functional groups that contribute to the desired physical crosslinking of the polymer to achieve a crosslinked network that is substantially insoluble in traditional photoresist solvents, but can also be decrosslinked upon heating to a sufficiently high temperature, rendering the composition substantially soluble in typical photoresist solvents. Preferred functional groups include acid groups selected from the group consisting of carboxylics, anhydrides, amic acids, amines, and combinations of the foregoing.

The polymers preferably have a weight average molecular weight ($M_w$) of from about 500 Daltons to about 25,000 Daltons, and more preferably from about 1,500 Daltons to about 5,000 Daltons. Preferred polymers are formed from the polymerization of compounds selected from the group consisting of styrenics, acrylics, vinyl ethers, anhydrides, and mixtures thereof.

Particularly preferred polymers comprise recurring monomers of

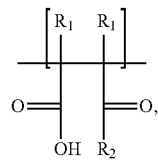

where each $R_1$ is individually selected from the group consisting of —H, and alkyls (preferably $C_1$-$C_{20}$ alkyls, more preferably $C_1$-$C_8$ alkyls); and each $R_2$ is individually selected from the group consisting of —$OR_3$, and —$NHR_3$, where each $R_3$ is individually selected from the group consisting of —H, alkyls (preferably $C_1$-$C_{20}$ alkyls, more preferably $C_1$-$C_8$ alkyls), cycloalkyls (preferably $C_1$-$C_{20}$ alkyls, more preferably $C_1$-$C_8$ alkyls), and substituted and unsubstituted aryl groups (preferably $C_6$-$C_{10}$ aryl groups). Suitable substituted aryl groups include the ether-, acetyl-, aromatic-, ester-, hydroxy-, alkoxy-, cyano-, amide-, imide-, and silyl-substituted derivatives thereof. It will be appreciated that the substitutions can be modified depending upon the desired functionality of the polymer. In a preferred embodiment, where $R_2$ is —$OR_3$, $R_3$ is preferably an aryl group other than anthracene (i.e., is not anthracene or a derivative thereof).

In another embodiment, preferred polymers are polyamic acids such as those including recurring monomers having the formulas

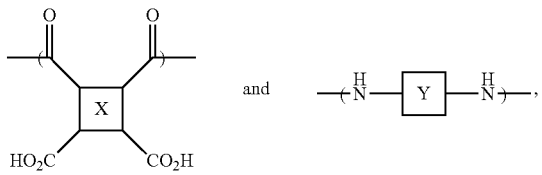

where each of X and Y is individually selected from the group consisting of aryl and aliphatic groups.

Preferred X and Y groups include those selected from the group consisting of substituted and unsubstituted phenyl, biphenyl, naphthyl, and anthryl groups, and substituted and unsubstituted $C_1$-$C_{12}$ aliphatic (preferably alkyl) groups. The synthesis of this polymer is described in U.S. Pat. No. 7,364,835, incorporated by reference herein.

The preferred inventive compositions will also include a crosslinker (used interchangeably herein with the term "crosslinking agent"). Preferred crosslinkers are selected from the group consisting of vinyl ether crosslinkers and alcohol crosslinkers. An example of commercially-available vinyl ethers include those sold under the trade name VEctomer™ (Aldrich; St. Louis, Mo.). It is particularly preferred that the crosslinkers be multi-functional (di-, tri-, and tetra-functional) vinyl ethers and alcohols. The crosslinker is preferably present in the composition at a level of from about 5 to about 30% by weight, preferably from about 15 to about 30% by weight, and even more preferably from about 15 to about 25% by weight, based upon the total weight of the polymer in the composition taken as 100% by weight.

More preferably, the vinyl ether crosslinkers, when present, have the formula $$R'—(X—O—CH=CH_2)_n,$$

where R' is selected from the group consisting of aryls (preferably $C_6$-$C_{14}$) and alkyls (preferably $C_1$-$C_{18}$, and more preferably $C_1$-$C_{10}$), each X is individually selected from the group consisting of alkyls (preferably $C_1$-$C_{18}$, and more preferably $C_1$-$C_{10}$), alkoxys (preferably $C_1$-$C_{18}$, and more preferably $C_1$-$C_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of

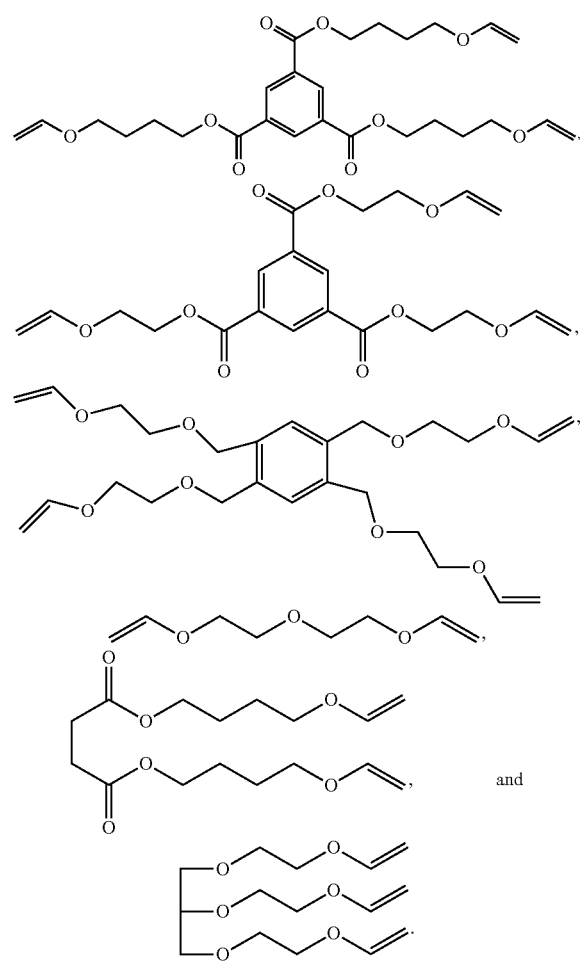

Preferred alcohol crosslinkers, when present, have the formula:

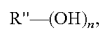

R''—(OH)$_n$, where R'' is preferably non-aromatic, and is selected from the group consisting of saturated and unsaturated alkyls (i.e., alkanes, alkenes, etc.; preferably $C_1$-$C_{12}$ alkyls, and more preferably $C_1$-$C_8$ alkyls), and n is at least 2, and preferably from 2-6. The most preferred alcohols include those selected from the group consisting of glycols, trimethylolpropane, glycerol, and mixtures thereof.

It will be appreciated that a number of optional ingredients can be included in the compositions as well. Typical optional ingredients include surfactants, adhesion promoters, antioxidants, catalysts, photosensitive compounds (e.g., photoacid generators), and combinations of the foregoing. However, in preferred embodiments, the compositions will be essentially free (less than about 0.1% and preferably about 0% by weight) of one or more of these optional ingredients.

Regardless of the embodiment, the till compositions are formed by simply dispersing or dissolving the polymers in a suitable solvent system, preferably at ambient conditions, and for a sufficient amount of time to form a substantially homogeneous solution. Any additional ingredients are also preferably dispersed in the solvent system along with the polymer.

Preferred solvent systems include a solvent selected from the group consisting of propylene glycol methyl ether acetate (PGMEA), propylene glycol methyl ether (PGME), ethyl lactate, propylene glycol n-propyl ether (PnP), cyclohexanone, and mixtures thereof. Preferably, the solvent system has a boiling point of from about 110° C. to about 160° C., and more preferably from about 120° C. to about 140° C. The solvent system should be utilized at a level of from about 70 to about 99% by weight, and preferably from about 85 to about 95% by weight, based upon the total weight of the composition taken as 100% by weight.

The composition will preferably comprise about 1 to about 30% by weight solids, and preferably from about 5 to about 15% by weight solids, based upon the total weight of the composition taken as 100% by weight. The composition will also preferably have a crosslinking temperature of from about 120° C. to about 225° C., more preferably from about 160° C. to about 225° C., and even more preferably from about 160° C. to about 200° C.

The method of applying the compositions to a substrate (such as a microelectronic substrate) simply comprises applying a quantity of a composition hereof to the substrate surface by any known application method (including spin-coating). Preferably, the composition is spin-coated onto the substrate at speeds of from about 800 rpm to about 5,000 rpm (preferably from about 1,000 rpm to about 2,500 rpm) for a time period of from about 5 seconds to about 60 seconds (preferably from about 5 seconds to about 15 seconds).

The substrate can be any microelectronic substrate. Preferred substrates include those commonly used in dual damascene structures, with particularly preferred substrates being selected from the group consisting of silicon, aluminum, tungsten, tungsten silicide, gallium arsenide, germanium, tantalum, tantalum nitrite, and SiGe, dielectric layers, low-k dielectric layers (e.g., silicon oxide), ultra low-k dielectric layers, and ion implant layers.

The substrate utilized can be planar, but will preferably include topography (e.g., contact holes, via holes, raised features, trenches). This topography can be included directly on the substrate surface, or it can be included in one or more layers of other material formed on the substrate surface. According to one embodiment, the substrate can have a hole formed therein and being defined by a bottom wall and sidewalls, the bottom wall and sidewalls having respective surfaces. The composition is preferably applied to at least a portion of the hole sidewalls and bottom wall. Thus, in the resulting structure, the composition preferably forms a layer on the substrate surface that will be in contact with at least a portion of the surfaces of the bottom wall and sidewalls. It will be appreciated that the inventive composition can be used in both partial-fill (i.e., where from about 35% to about 65% of the hole's depth is filled with the composition) and full-fill (i.e., where at least about 95%, and preferably about 100% of the hole's depth is filled) applications.

After the desired coverage is achieved, the polymer in the composition should be crosslinked to yield a crosslinked or cured layer. Preferably, the composition is heated to a temperature sufficient to induce crosslinking of the polymer in the composition (i.e., the composition's crosslinking temperature), but still less than the decomposition temperature of the composition. That is, the composition is preferably heated to a temperature of from about 120° C. to about 225° C., more preferably from about 160° C. to about 225° C., and even more preferably from about 160° C. to about 200° C., for time periods of from about 10 seconds to about 60 seconds to induce thermal crosslinking of the polymer to yield a crosslinked layer. The thickness of the crosslinked layer will typically be from about 30 nm to about 500 nm, and preferably from about 200 nm to about 500 nm.

Advantageously, the crosslinked layer will be substantially insoluble in typical photoresist solvents (including those solvents used to form the inventive composition), such as ethyl lactate, PGME, PGMEA, PnP, cyclohexanone, Gamma butyrolactone (GBL) and mixtures thereof. Thus, when subjected to a stripping test, the crosslinked layer will have a percent stripping of less than about 5%, preferably less than about 1%, and even more preferably about 0%. The stripping test involves first determining the thickness (by taking the average of measurements at five different locations) of the crosslinked layer. This is the initial average film thickness. Next, a photoresist solvent (e.g., ethyl lactate) is puddled onto the cured film for about 20 seconds, followed by spin drying at about 2000 rpm for about 60 seconds to remove the solvent, The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

In embodiments where light absorbance is desirable, the n value of the cured layer will be from about 1.4 to about 2.2, and preferably from about 1.6 to about 1.9, while the k value will be from about 0 to about 1, and preferably from about 0.1 to about 0.5, at the wavelength of use (e.g., 193 nm, 248 nm).

After the material is cured or crosslinked, further steps can be carried out as necessary for the particular manufacturing process. For example, a photoresist can be applied to the cured material or to an intermediate layer on the composition layer, with the photoresist being patterned according to conventional processes. Since the inventive method is particularly well-suited for via-first methods, this patterning will typically involve patterning the desired trenches, followed by etching (e.g., plasma etching) of those trenches into the substrate.

After the desired additional processing steps, the cured or crosslinked layer can be heated to a temperature sufficient to thermally reverse the curing mechanism. Preferably, the layer is heated to a temperature of at least about 25° C. greater than the crosslinking temperature of the composition, more preferably from about 25° C. to about 60° C. greater than the crosslinking temperature of the composition, and even more preferably from about 25° C. to about 40° C. greater than the crosslinking temperature of the composition. More preferably, the layer is heated to a temperature of at least about 225° C., and even more preferably from about 225° C. to about 250° C., to decompose or release the crosslinks in the layer. An example of the crosslinking and thermal decrosslinking or decomposition of a composition of the invention is shown in the reaction scheme below, with R and X in the crosslinker being defined as above for the vinyl ether crosslinkers.

Scheme A

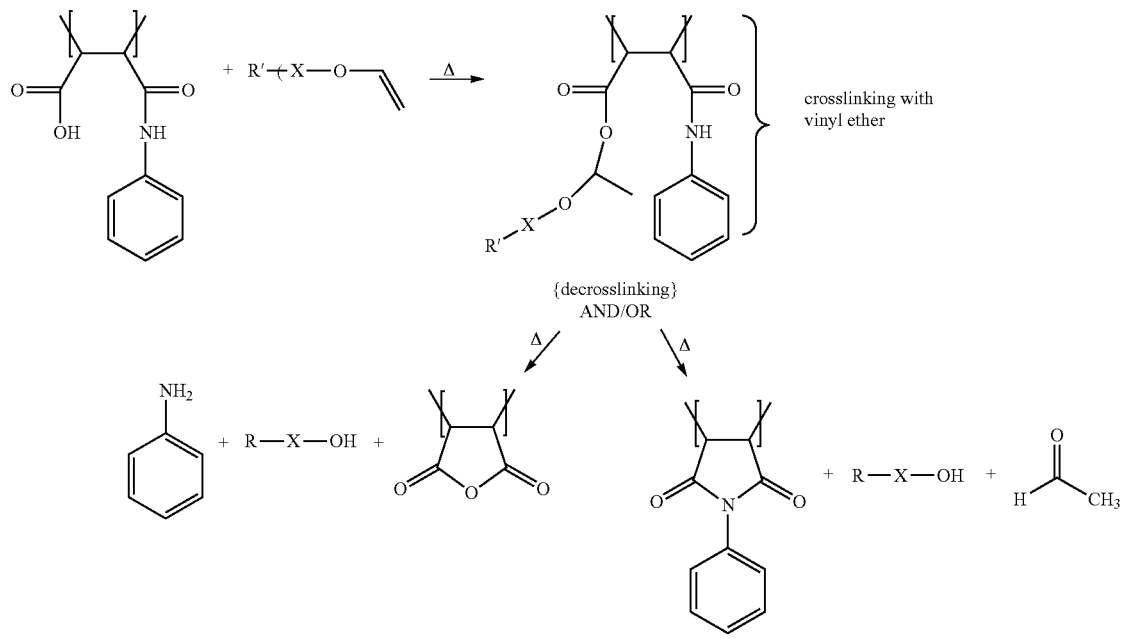

Thus, the polymer is decrosslinked or decomposed to yield a composition layer comprising recurring monomers of

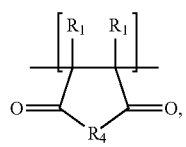

where each $R_1$ is individually selected from the group consisting of —H and alkyls (preferably $C_1$-$C_{20}$ alkyls, more preferably $C_1$-$C_8$ alkyls); and each $R_4$ is individually selected from the group consisting of

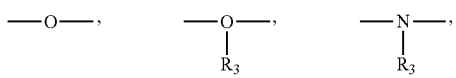

where each $R_3$ is defined as previously.

It will be appreciated that after the composition has been decrosslinked or decomposed, the inventive coatings are once again rendered soluble in conventional photoresist solvents (including those solvents used in the solvent system of the starting composition). That is, the layer can then be at least about 95%, preferably at least about 99%, and more preferably 100% removed by conventional photoresist solvents, such as PGME, PGMEA, PnP, ethyl lactate, and mixtures thereof.

This high percent solubility in commercially-available solvents is a significant advantage over the prior art allowing the composition to be easily removed from substrate structures (i.e., vias, trenches) after the pattern has been transferred to the substrate using an etch process. Thus, unlike prior art compositions, which require an oxygen plasma ash process, the inventive compositions can be thermally decrosslinked and removed using conventional solvents. This mechanism eliminates the need for removal processes that damage low-k films, thus also eliminating the need for processes used to repair damaged films. It also minimizes the number of chemicals needed during processing, since the same solvent used in making the original composition can be used to remove the composition after processing. The present invention results in greater efficiency and reduced manufacturing costs, ultimately leading to improved resistance-capacitance (RC) performance of the overall device at a lower cost.

EXAMPLES

The following examples set forth preferred methods in accordance with the invention. It is to be understood, however, that these examples are provided by way of illustration and nothing therein should be taken as a limitation upon the overall scope of the invention.

Example 1

Crosslinker Formulation

In this Example, the crosslinker was prepared by adding 25.15 grams of tetramethylene glycol monovinyl ether (Aldrich, St Louis, Mo.), 22.91 grams of triethylamine (Aldrich, St Louis, Mo.), and 250 ml tetrahydrofuran ("THF"; Aldrich, St. Louis, Mo.) to a 500-ml, 2-neck flask. The flask was equipped with a stir bar, addition funnel, condenser, and nitrogen inlet and outlet. The flask was immersed in an ice water bath and the solution was stirred under a flow of nitrogen.

Next, 20.00 grams of 1,3,5-benzenetricarbonyl trichloride (Aldrich, St. Louis, Mo.) were dissolved in 50 ml THF in a 250-ml Erlenmeyer flask. This solution was transferred to the addition funnel on the 500-ml 2-neck flask and added dropwise to the stirring 2-(vinyloxy)ethanol/triethylamine/THF solution for about 15 minutes, until the addition was completed. A white precipitate formed on contact. The flask was then removed from the ice bath and the slurry was allowed to come to room temperature in the flask, which took approximately 16 hours. The slurry was then heated to reflux for 4 hours. The flask was removed from the heat and allowed to cool to room temperature. The slurry was then filtered using a suction filtration setup, and concentrated using a rotary evaporator to give a viscous yellow liquid.

This liquid was dissolved in 100 ml of diethylether (Aldrich, St. Louis, Mo.) and washed twice with 25-ml portions of aqueous, 12.5% tetramethylammonium hydroxide (TMAH; Aldrich, St. Louis, Mo.). The ether layer was extracted using a reparatory funnel and then washed twice using 50-ml portions of deionized water. The ether layer was allowed to settle out and collected. The ether layer was dried by mixing with 5.0 g of activated basic alumina. The mixture was stirred for 1 hour and gravity filtered. The clear yellow liquid was concentrated in a rotavap to give a yellow viscous oil. Total yield was approximately 29.28 grams (77% yield). The vinyl ether crosslinker (1,3,5-benzenetricarboxylic acid, tris[4-(ethenyloxy)butyl]ester), had the following structure:

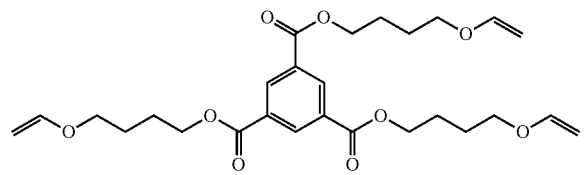

Example 2

Polymer Formulation

To make the polymer, 2.4 grams of aniline (Aldrich, St. Louis, Mo.) and 40.0 grams of PUMEA (Harcross, St. Louis, Mo.) were added to 10.0 grams of poly(styrene-co-maleic anhydride) ($M_n$=1900, 3:1 ratio of styrene to maleic anhydride; Aldrich, St. Louis, Mo.). The material was stirred at room temperature for 24 hours, which produced a homogenous transparent solution.

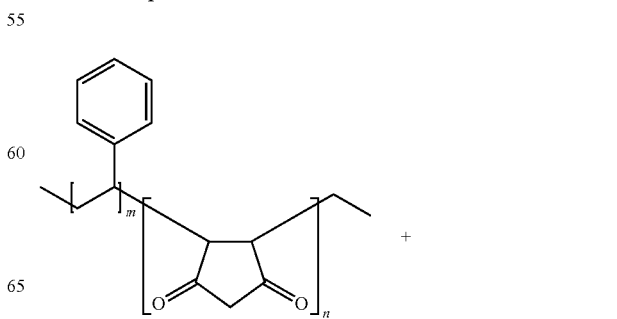

-continued

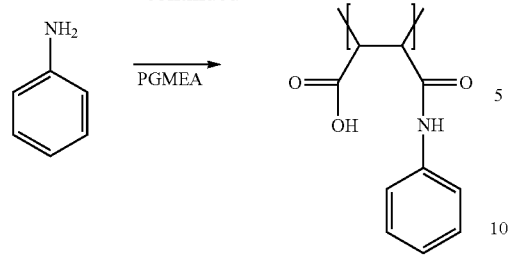

m:n = 3:1

Example 3

Preparation and Testing of Fill Composition

A fill composition was prepared from the polymer and crosslinker prepared in Examples 1-2 above. In this preparation, 4.17 grams of the polymer solution were added to 0.17 grams of the crosslinker in 2.37 grams of PGMEA and 13.61 grams of PGME (Harcross, St. Louis, Mo.). The mixture was stirred and formed a homogenous transparent solution. The inventive composition was then spin-coated at 1,500 rpm for 60 seconds onto a 100-mm silicon wafer. The wafer was baked at 170° C. for 60 seconds using a contact hot plate. The thickness of the resulting film was measured (e.g., the initial thickness).

The solvent resistance (stripping in nm) of the composition was then determined. A solvent resistance test was performed by applying a common resist solvent (i.e., ethyl lactate) to the film for 20 seconds, followed by spin-drying at 2000 rpm until dry (approximately 60 seconds). The film thickness was measured again (e.g., final thickness), and no film loss was reported, indicating that the composition had been thermally crosslinked.

A second wafer was coated as described above and then baked at 205° C. for 60 seconds using a contact hot plate. The thickness of the resulting film was measured. The above solvent resistance test was then repeated by applying ethyl lactate to the film for 20 seconds, followed by spin-drying at 2000 rpm until dry (approximately 60 seconds). The final thickness of the film was measured and recorded. The above procedure was repeated a third time on a third wafer, except that the wafer was baked at 225° C. for 60 seconds. The initial thickness was measured, and the solvent application was then repeated. The final thickness was measured and recorded. The test results are indicated in Table 1 below. The above three coating, baking, and testing steps were carried out again on the same wafer each time rather than three different wafers. The same results were achieved as shown in Table 1.

TABLE 1

| Bake temp (° C.) | Initial thickness (nm) | Final thickness (nm) |
|---|---|---|
| 170 | 197 | 197 |
| 205 | 179 | 154 |
| 225 | 152 | 0 |

As can be seen from the table above, at 170° C. the polymer is crosslinked in the composition, and was completely insoluble in the photoresist solvent. However, at a temperature above the crosslinking temperature of the composition the film became soluble in the solvent. When heated to 225° C., the film became substantially completely soluble in the solvent, and was completely washed away by the solvent.

Example 4

Crosslinker Formulation

In this Example, the preparation of another crosslinker is described. The crosslinker can be prepared by adding 24.70 grams of 2-(vinyloxy)ethanol, 27.44 grams of triethylamine, and 300 ml THF to a 500-ml, 2-neck flask. The solution can be immersed in an ice water bath and stirred under a flow of nitrogen.

Next, 24.01 grams of 1,3,5-benzenetricarbonyl trichloride can be dissolved in 100 ml THF in a 250-ml Erlenmeyer flask. This solution will then be added dropwise to the 2-(vinyloxy)ethanol/triethylamine/THF solution until the addition is complete. The slurry can then be brought to room temperature and then heated to reflux for about 4 hours. The slurry can be cooled to room temperature and then filtered using a suction filtration setup. The solution will then be concentrated using a rotary evaporator to give a viscous yellow liquid.

Next, the liquid will be dissolved in 100 ml of ether and washed twice with 50-ml portions of aqueous TMAH. The ether layer can then be extracted and washed twice using 50-ml portions of deionized water. The ether layer will then be dried over anhydrous magnesium sulfate. Finally, the solvent can be removed under pressure. The resulting vinyl ether crosslinker will have the following structure:

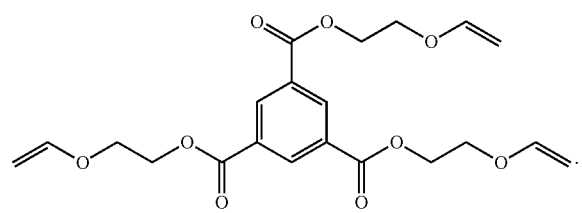

We claim:
1. A method of forming a microelectronic structure, said method comprising:
    providing a substrate having a surface;
    applying a composition to at least a portion of said surface, said composition comprising a polymer dispersed or dissolved in a solvent system, said polymer comprising an acid group;
    crosslinking said polymer in said composition to yield a crosslinked layer; and
    heating said crosslinked layer to a temperature of at least about 225° C. so as to thermally decrosslink or decompose said polymer.
2. The method of claim 1, wherein said crosslinking step comprises thermally crosslinking said polymer in said composition.
3. The method of claim 1, wherein said crosslinked layer is substantially insoluble in photoresist solvents.
4. The method of claim 1, wherein said acid group is selected from the group consisting of carboxylics, anhydrides, amic acids, and mixtures thereof.
5. The method of claim 1, wherein said composition further comprises a crosslinker dissolved or dispersed said solvent system, said crosslinker being selected from the group consisting of vinyl ethers, alcohols, and mixtures thereof.

6. The method of claim 5, where said crosslinker is a vinyl ether having the formula R'—(X—O—CH=CH$_2$)$_n$, where:
n is at least 2;
R' is selected from the group consisting of aryls and alkyls; and
each X is individually selected from the group consisting of alkyls, alkoxys, carbonyls, and combinations of two or more of the foregoing.

7. The method of claim 5, wherein said crosslinker is an alcohol having the formula R''—(OH)$_n$, where:
n is at least 2; and
R'' is selected from the group consisting of saturated and unsaturated alkyls.

8. The method of claim 1, wherein said polymer comprises recurring monomers of

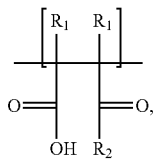

where:
each $R_1$ is individually selected from the group consisting of —H, and alkyls; and
each $R_2$ is individually selected from the group consisting of —OR$_3$, and —NHR$_3$, where each $R_3$ is individually selected from the group consisting of —H, alkyl groups, cycloalkyl groups, and substituted and unsubstituted aryl groups.

9. The method of claim 1, wherein said polymer comprises recurring monomers of

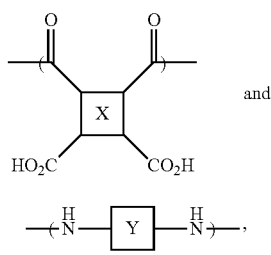

where each of X and Y is individually selected from the group consisting of aryl and aliphatic groups.

10. The method of claim 1, further comprising the step of applying a layer adjacent said crosslinked layer prior to said heating, said layer being selected from the group consisting of photoresists, anti-reflective coatings, hardmasks, and combinations thereof.

11. The method of claim 10, wherein said layer is a photoresist layer, said method further comprising patterning said photoresist layer.

12. The method of claim 1, wherein:
said substrate further comprises structure defining a hole, said structure including sidewalls and a bottom wall; and
said applying comprises applying the composition to at least a portion of said hole sidewalls and bottom wall.

13. The method of claim 12, wherein said hole is at least about 95% filled with said composition after said applying.

14. The method of claim 1, wherein said heating yields a composition layer that is substantially soluble in photoresist solvents.

15. The method of claim 1, wherein said heating yields a layer of composition comprising recurring monomers of

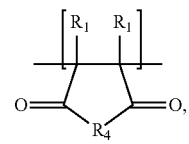

where:
each $R_1$ is individually selected from the group consisting of —H, and alkyls; and
each $R_4$ is individually selected from the group consisting of

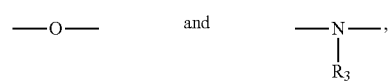

where each $R_3$ is individually selected from the group consisting of substituted and unsubstituted aryl groups, alkyl groups, and cycloalkyl groups.

16. The method of claim 1, further comprising contacting said composition with a photoresist solvent after said heating so as to substantially remove said composition from said substrate.

17. The method of claim 1, wherein said substrate is a microelectronic substrate.

18. The method of claim 17, wherein said substrate is selected from the group consisting of silicon, aluminum, tungsten, tungsten silicide, gallium arsenide, germanium, tantalum, tantalum nitride, and SiGe, dielectric layers, low-k dielectric layers, ultra low-k dielectric layers, and ion implant layers.

19. The method of claim 1, wherein said substrate comprises an ion implant layer, and said applying comprises forming a layer of said composition adjacent said ion implant layer.

20. The method of claim 1, wherein said composition is essentially free of photoacid generators.

21. The method of claim 1, wherein said composition is essentially free of catalysts.

22. A method of forming a microelectronic structure, said method consisting of:
providing a substrate having a surface;
applying a composition to at least a portion of said surface, said composition having a crosslinking temperature and comprising a polymer dispersed or dissolved in a solvent system, said polymer comprising an acid group;
crosslinking said polymer in said composition to yield a crosslinked layer; and heating said crosslinked layer to a temperature of at least about 25° C. greater than said crosslinking temperature so as to thermally decrosslink or decompose said polymer.

23. A method of forming a microelectronic structure, said method comprising:

providing a substrate having a surface;

applying a composition to at least a portion of said surface, said composition having a crosslinking temperature and comprising a polymer dispersed or dissolved in a solvent system and being essentially free of photoacid generators, said polymer comprising an acid group;

crosslinking said polymer in said composition to yield a crosslinked layer; and heating said crosslinked layer to a temperature of at least about 25° C. greater than said crosslinking temperature so as to thermally decrosslink or decompose said polymer.

* * * * *